United States Patent
Lee et al.

(10) Patent No.: US 7,871,906 B2
(45) Date of Patent: Jan. 18, 2011

(54) STORAGE NODES INCLUDING A PHASE CHANG LAYER AND METHODS OF MANUFACTURING AND OPERATING THE SAME, PHASE CHANGE MEMORY DEVICES AND METHODS OF MANUFACTURING AND OPERATING THE SAME

(75) Inventors: Jun-ho Lee, Seoul (KR); Sung-kwan Kang, Seoul (KR); Hion-suck Baik, Cheonan-si (KR); Jong-wook Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,396

(22) Filed: Dec. 18, 2009

(65) Prior Publication Data

US 2010/0105193 A1    Apr. 29, 2010

Related U.S. Application Data

(62) Division of application No. 12/000,829, filed on Dec. 18, 2007, now abandoned.

(30) Foreign Application Priority Data

Dec. 19, 2006    (KR)    ............... 10-2006-0130443

(51) Int. Cl.
*H01L 21/20*    (2006.01)

(52) U.S. Cl. ............... 438/478; 438/95; 438/237; 257/E21.158

(58) Field of Classification Search ............... 438/95, 438/237, 478; 257/E21.158
See application file for complete search history.

(56) References Cited

U.S. PATENT DOCUMENTS

| | | | |
|---|---|---|---|
| 6,121,134 | A | 9/2000 | Burton et al. |
| 2003/0116794 | A1* | 6/2003 | Lowrey ............... 257/296 |
| 2004/0084772 | A1 | 5/2004 | Iyer et al. |
| 2004/0113232 | A1 | 6/2004 | Johnson et al. |
| 2005/0029587 | A1* | 2/2005 | Harshfield ............ 257/330 |
| 2005/0101084 | A1* | 5/2005 | Gilton ............... 438/232 |
| 2005/0227496 | A1 | 10/2005 | Park et al. |
| 2006/0237756 | A1 | 10/2006 | Park et al. |
| 2007/0080421 | A1* | 4/2007 | Lee et al. ............. 257/486 |

* cited by examiner

*Primary Examiner*—Thanh V Pham
*Assistant Examiner*—Duy T Nguyen
(74) *Attorney, Agent, or Firm*—Harness, Dickey & Pierce P.L.C.

(57) ABSTRACT

In various embodiments, the present disclosure may provide a storage node. In various implementations, the storage node may include a bottom electrode having a non-planar bottom surface that conforms with and is connected to a non-planar top surface of a diode electrode of a memory device. The storage node may further include a phase change layer on top of a bottom diode and a top electrode on a top surface of a phase change layer.

9 Claims, 6 Drawing Sheets

FIG. 12

STORAGE NODES INCLUDING A PHASE CHANG LAYER AND METHODS OF MANUFACTURING AND OPERATING THE SAME, PHASE CHANGE MEMORY DEVICES AND METHODS OF MANUFACTURING AND OPERATING THE SAME

PRIORITY STATEMENT

This application is a divisional of U.S. application Ser. No. 12/000,829 filed on Dec. 18, 2007 now abandoned, which claims priority under 35 U.S.C. §119 to Korean Patent Application No. 10-2006-0130443, filed on Dec. 19, 2006, in the Korean Intellectual Property Office, the disclosures of which are incorporated herein in their entirety by reference.

BACKGROUND

1. Field

The present disclosure relates to a semiconductor memory devices and methods of manufacturing and operating the same.

2. Description of the Related Art

Non-volatile memory devices may retain data stored therein even when not powered. Representative examples of non-volatile memory devices include flash memory devices and phase change memory devices. A unit cell of phase change memory devices may include a cell switching device and a storage node electrically connected to the switching device. The storage node may include a phase change material layer, a top electrode, and/or a bottom electrode. The phase change material layer may be disposed between the top and bottom electrodes. The cell switching device may be an active device such as a transistor or a vertical diode that must be electrically operated to record data to the phase change memory cell.

SUMMARY

In various embodiments, the present disclosure provides a storage node. In various implementations, the storage node may include a bottom electrode having a non-planar bottom surface that is connected to a switching device of a memory device. The storage node may further include a phase change layer on top of the bottom electrode and a top electrode on a top surface of the phase change layer.

In accordance with various other embodiments of the present disclosure, a phase change memory device is provided. In various implementations the phase change memory devices may include a semiconductor substrate and storage node that may include a bottom electrode having a non-planar bottom surface that is connected to a—switching device of the memory device. The storage node may further include a phase change layer on top of the bottom electrode and a top electrode on a top surface of the phase change layer.

In still other various embodiments, the present disclosure provides methods for manufacturing a phase change memory device may include forming an insulating interlayer on a semiconductor substrate, forming a hole in the insulating interlayer to expose the semiconductor substrate, forming a diode in a lower region of the hole, forming a diode electrode on the diode so that an exposed surface of the diode electrode is not planar, forming a bottom electrode to cover an exposed surface of the diode electrode, and sequentially forming a phase change layer and a top electrode on the bottom electrode.

In yet other various embodiments, the present disclosure provides a method of operating a phase change memory device including a diode and a storage node connected to the diode. The method may include applying an operating voltage to the storage node in a direction in which the diode can be turned on, wherein the storage node is connected to the diode by a diode electrode, and an interface between the storage node and the diode electrode is curved.

Accordingly, because a contact area between the bottom electrode of the storage node and the diode that is a switching device is increased and a contact resistance between the bottom electrode and the diode is reduced, a current flowing through a contact region between the bottom electrode and the diode can be increased, thereby improving the integration density of the phase change memory device.

BRIEF DESCRIPTION OF THE DRAWINGS

The above and other features and advantages of the present disclosure will become more apparent by describing in detail example embodiments thereof with reference to the attached drawings.

DETAILED DESCRIPTION

The present disclosure will now be described more fully with reference to the accompanying drawings, in which example embodiments are shown. In the drawings, the thicknesses of layers or regions are exaggerated for clarity. The following embodiments should not be construed as limiting the scope of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
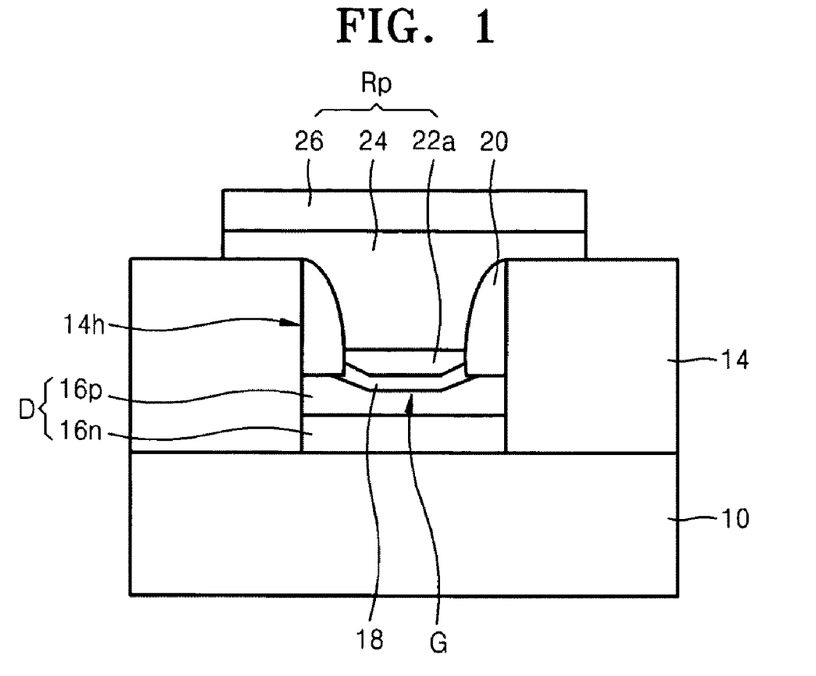
FIG. 1 is a cross-sectional view of a phase change memory device including a PN diode according to various example embodiments of the present disclosure.

FIG. 1 is a cross-sectional view of a phase change memory device, e.g., a phase change random access memory (PRAM), including a PN diode according to various embodiments of the present disclosure.

Referring to FIG. 1, a first insulating interlayer 14 may be disposed on a semiconductor substrate 10. The semiconductor substrate 10 may be an n-doped semiconductor substrate. The first insulating interlayer 14 may be a single insulating layer. In various implementations, the first insulating interlayer 14 may include a hole 14h through which the semiconductor substrate 10 is exposed. A diode. D may be disposed in a lower region of the hole 14h and may be a PN junction diode including a first semiconductor layer 16n and a second semiconductor layer 16p that are sequentially stacked on the semiconductor substrate 10. The first and second semiconductor layers 16n and 16p may include first or second conductive impurities. The first and second conductive impurities may be the same as or different from each other. One of the first and second conductive impurities may be an n-type impurity and the other may be a p-type impurity. When the first semiconductor layer 16n includes a first conductive impurity, for example, an n-type impurity and the second semiconductor layer 16p includes a second conductive impurity, for example, a p-type impurity, the first and second semiconductor layers 16n and 16p constitute a PN diode. When both the first and second semiconductor layers 16n and 16p include second conductive impurities, for example, p-type impurities, the first semiconductor layer 16n and the semiconductor substrate 10 may constitute a PN diode.

In various embodiments, the first semiconductor layer 16n may include any one of the first and second conductive impurities, and may have an impurity concentration lower than that of each of the semiconductor substrate 10 and the second semiconductor layer 16p. Such a configuration of the first semiconductor layer 16n will minimize leakage current through the diode D when a reverse bias voltage is applied to the diode D. In various forms, a top surface of the second semiconductor layer 16p may be non-planar and may have a diode electrode 18 disposed on the non-planar top surface of the second semiconductor layer 16p. For example, in various embodiments, the top surface of the second semiconductor layer 16p may be concave and the diode electrode 18 may thinly cover the concave top surface of the second semiconductor layer 16p without completely filling a concave portion of the second semiconductor layer 16p. In various embodiments, the diode electrode 18 may be thicker than the second semiconductor layer 16p if the recess G of the top surface of the diode D is maintained.

Accordingly, the diode electrode 18 may have a concave top surface conforming to the concave top surface of the second semiconductor layer 16p. In various alternative embodiments, the top surface of the second semiconductor layer 16p may be upwardly convex, rather than concave. More particularly, the top surface of the second semiconductor layer 16p may be non-planar, for example the top surface may be concave or convex. The concavity or convexity may be formed as a smooth surface, e.g., a rounded bowl or dome, or may be formed to have sides that join each other and a bottom at angled corners.

The diode electrode 18 may be a conductive layer, for example, a metal silicide layer. The metal silicide layer may be any suitable metal silicide layer such as a cobalt silicide ($CoSi_2$) layer, a titanium silicide ($TiSi_2$) layer, or a nickel silicide ($NiSi_2$) layer. Alternatively, the diode electrode 18 may be formed of at least one of $TiSi_2$, $CoSi_2$, and $NiSi_2$. The diode electrode 18 need not completely fill the hole 14h. Accordingly, the diode electrode 18 may have a top surface lower than a top surface of the first insulating interlayer 14. In some embodiments, a sidewall of the hole 14h over the diode electrode 18 may be covered by an annular spacer 20 that covers an edge of the diode electrode 18. Additionally, in various embodiments, the exposed non-planar surface of the diode electrode 18 inside the spacer 20 may be covered by a bottom electrode 22a. In accordance with various implementations, an upper region of the hole 14h over the bottom electrode 22a and surrounded by the spacer 20 may be filled with a phase change layer 24. As a result, the spacer 20 may be disposed between the bottom electrode 22a and the phase layer 24 and the sidewall of the hole 14h facing the bottom electrode 22a and the phase change layer 24. In various example configurations, the phase change layer 24 may extend beyond the first insulating interlayer 14 around the hole 14h and a top electrode 26 may be disposed on the phase change layer 24.

Because the bottom electrode 22a may cover the non-planar top surface of the diode electrode 18, the bottom electrode 22a and the diode electrode 18 may have a non-planar interface therebetween. Additionally, regions for forming the bottom electrode 22a and the phase change layer are limited by the spacer 20.

In accordance with various embodiments, the bottom electrode 22a may be formed of a conductive material that does not react with the phase change layer 24. For example, the bottom electrode 22a may be a titanium nitride (TiN) electrode or a titanium aluminum nitride (TiAlN) electrode. Accordingly, the bottom electrode 22a may act as a thermally stable heater. The bottom electrode 22a, the phase change layer 24, and/or the top electrode 26 sequentially stacked on the diode electrode 18 collectively function as a storage node Rp in which data is stored.

Figure 2:
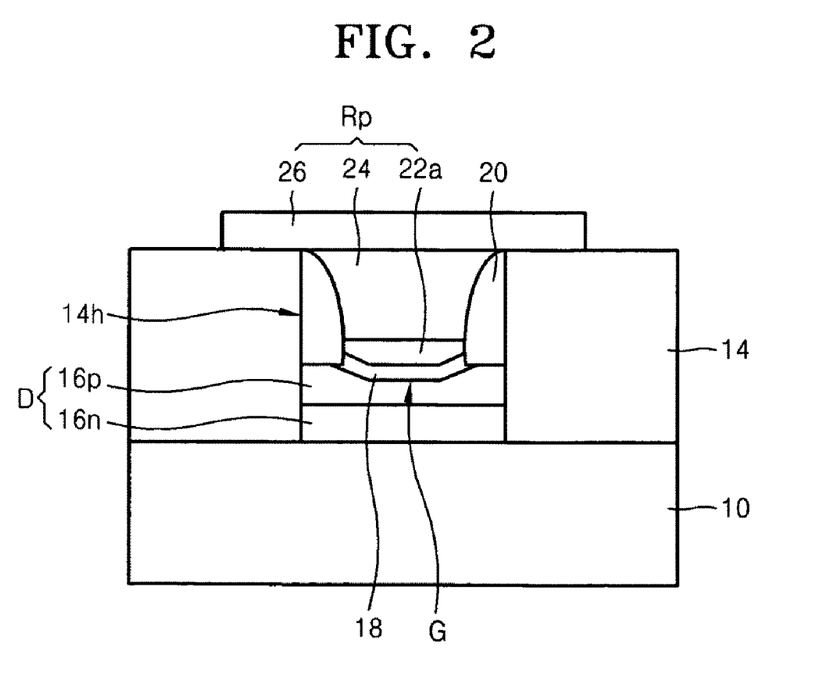
FIG. 2 is a cross-sectional view illustrating a modification of a storage node of the phase change memory device of FIG. 1 in accordance with various embodiments.

As shown in FIG. 2, in various embodiments, the phase change layer 24 may fill the hole 14h without extending beyond the first insulating interlayer 14 such that only the top electrode 26 is disposed over the first insulating interlayer 14.

In various implementations, the phase change layer 24 may be a germanium-antimony-tellurium (GeSbTe, GST) layer or a chalcogenide layer and the top electrode 26 may be an electrode formed of a conductive material that does not react with the phase change layer 24, for example, a TiN electrode or a TiAlN electrode.

As described above, because the spacer 20 may be disposed between the sidewall of the hole 14h and the bottom electrode 22a and the phase change layer 24, a contact area between the phase change layer 24 and the bottom electrode 22a may be reduced. As a result, heat generation efficiency in an interface between the bottom electrode 22a and the phase change layer 24 is increased, thereby reducing a program current.

FIGS. 3 through 10 are example cross-sectional views illustrating a method of manufacturing the phase change memory device of FIG. 1, in accordance with various embodiments of the present disclosure.

Figure 3:
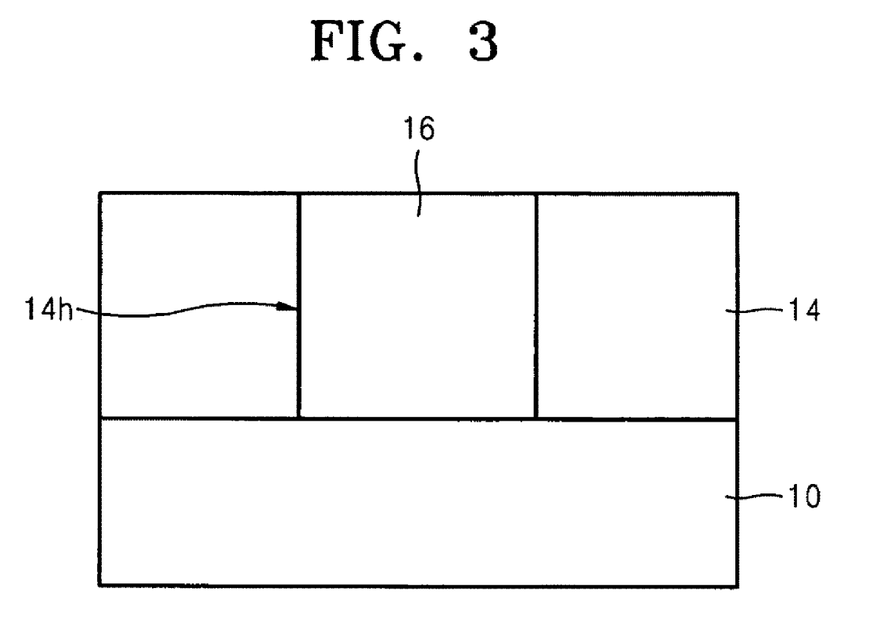
FIGS. 3 through 9 are cross-sectional views illustrating a method of manufacturing the phase change memory device of FIG. 1, according to various example embodiments of the present disclosure.

Referring to FIG. 3, the first insulating interlayer 14 may be formed on the semiconductor substrate 10 and may be a single insulating layer. The first insulating interlayer 14 may be patterned to form a hole 14h exposing a portion of the semiconductor substrate 10 and the hole 14h may be filled with a semiconductor layer 16. The semiconductor layer 16 may be formed by a selective epitaxial growth method using the portion of semiconductor substrate 10 exposed through the hole 14h as a seed layer. Accordingly, when the semiconductor substrate 10 has a single crystal structure, the semiconductor layer 16 may be grown to have a single crystal structure. Additionally, the semiconductor layer 16 may be grown to have a top surface higher than a top surface of the first insulating interlayer 14. When the top surface of the semiconductor layer 16 is grown higher than the top surface of the insulating interlayer 14, the semiconductor layer 16 may be planarized until the first insulating interlayer 14 is exposed. The semiconductor layer 16 may be a silicon layer and may be formed by chemical vapor deposition (CVD), and may be subjected to a planarization process. When the semiconductor layer 16 is formed by CVD, the semiconductor layer 16 may be a poly-crystalline.

Figure 4:
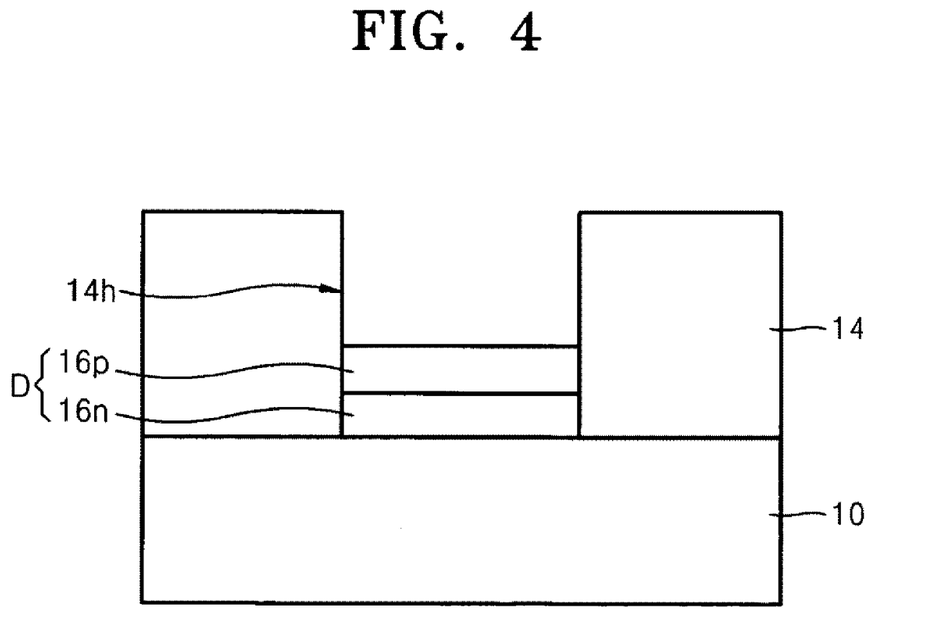

Referring to FIGS. 3 and 4, the semiconductor layer 16 may be partially etched such that the top surface of the semiconductor layer 16 may be lower than the top surface of the first insulating interlayer 14. That is, a part of the semiconductor layer 16 may be removed from the hole 14h. A first conductive impurity may be doped into a lower region of the semiconductor layer 16 left in the hole 14h. A second conductive impurity may be doped into an upper region of the semiconductor layer 16 left in the hole 14h. The lower region of the semiconductor layer 16 doped with the first conductive impurity may be referred to as a first semiconductor layer 16n, and the upper region of the semiconductor layer 16 doped with the second conductive impurity is referred to as a second semiconductor layer 16p. The first and second conductive impurities are any one of n-type and p-type impurities. The ion implantation for forming the first semiconductor layer 16n may be performed after the ion implantation for forming the second semiconductor layer 16p. When the first conductive impurity implanted into the first semiconductor layer 16n is the same type as the impurity doped into the semiconductor substrate 10, the first and second semiconductor layers 16n and 16p sequentially stacked in the hole 14 constitute a diode D.

Generally, each of the respective first semiconductor layer 16n, the second semiconductor layer 6p and the semiconductor substrate 10 can be doped with n or p impurities such that the combination of any two or more of the respective semiconductor layers 16n/16p and/or the substrate 10 form a diode.

When the first and second conductive impurities doped into the first and second semiconductor layers 16n and 16p are the same type as each other, for example, a p-type impurity, and different from an impurity, for example, n-type impurity, implanted into the semiconductor substrate 10, the semiconductor substrate 10 and the first semiconductor layer 16n contacting the semiconductor substrate 10 constitute a diode D.

During the ion implantation, the first semiconductor layer 16n may be doped with a concentration lower than that of each of the semiconductor substrate 10 and the second semiconductor layer 16p in order to reduce or minimize current leakage through the diode D when a reverse bias voltage is applied to the diode D.

Figure 5:
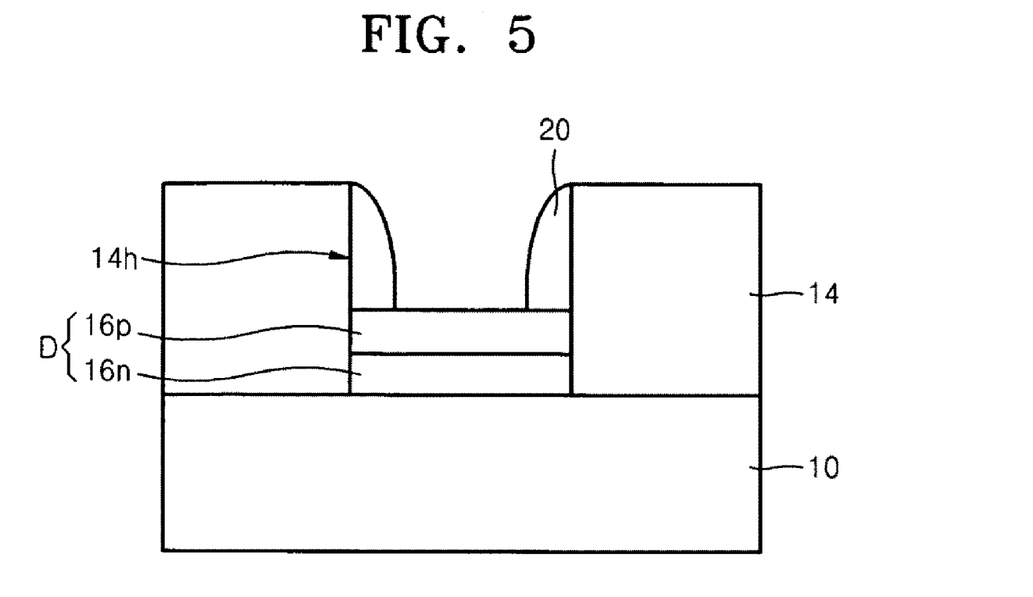
Figure 6:
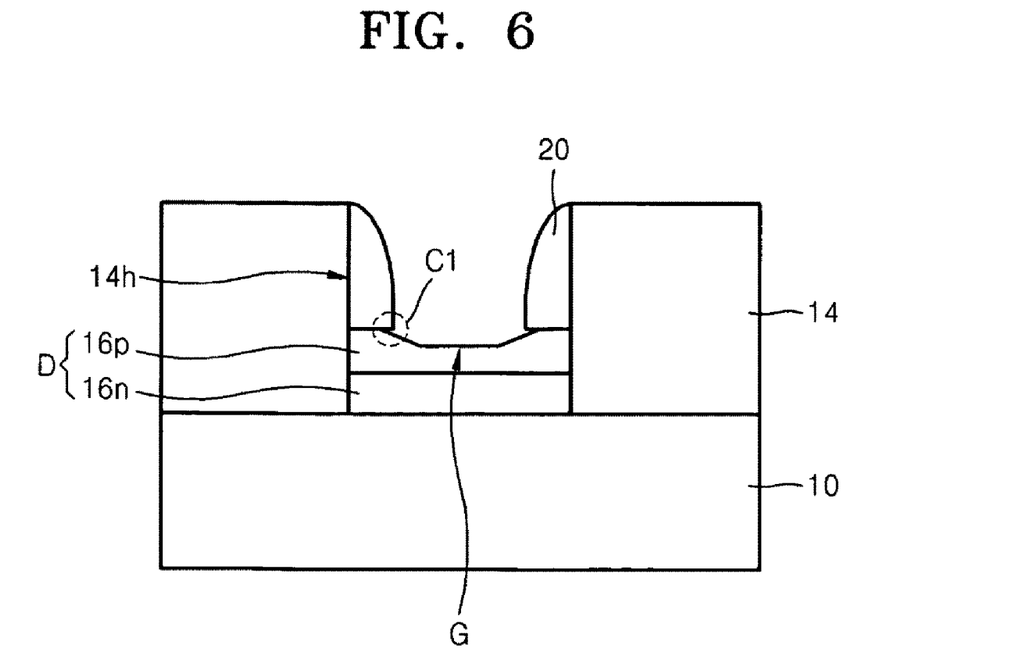

Referring to FIGS. 3, 4 and 5, the insulating contact spacer 20 may be formed on a sidewall of the hole 14h over the second semiconductor layer 16p, as described above. The spacer 20 may be formed of an insulating layer, for example, a silicon nitride layer.

For example, the spacer 20 may be formed by forming the insulating layer 14 on the semiconductor substrate 10 having the hole 14h and anisotropically etching an entire top surface of the insulating layer 14. The spacer 20 may cover an edge of the second semiconductor layer 16p. Accordingly, the area of the second semiconductor layer 16p exposed through the hole 14h may be less than that before the spacer 20 is formed.

Referring to FIGS. 3, 4, 5 and 6, the exposed surface of the second semiconductor layer 16p inside the spacer 20 may be etched back for a given period of time to form a recess G, e.g., the non-planar top surface, in the second semiconductor layer 16p. During the etch-back process, portions of the second semiconductor layer 16p under the spacers 20 may also be partially etched to form an undercut C1 under the spacer 20 through which a bottom surface of the spacer 20 is partially exposed. The recess G may include the undercut. The etch-back process may be performed using any etchant suitable to etch the material of the second semiconductor layer 16p, for example, a gas mixture of hydrogen chloride (HCl) and silane ($SiH_4$).

Figure 10:
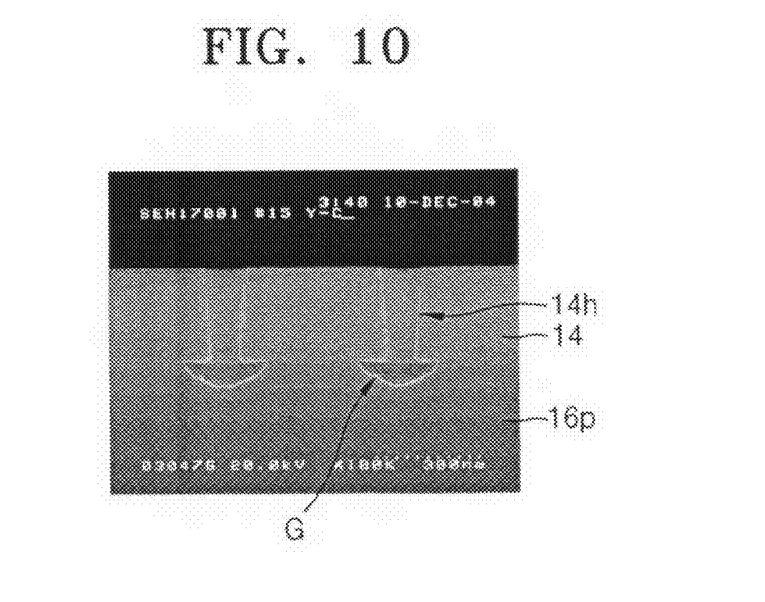
FIGS. 10 through 12 are scanning electron microscopy (SEM) photographs illustrating a recess formed by an etch-back process in a second semiconductor layer of a diode exposed through a hole, in accordance with various embodiments of the present disclosure.
Figure 11:
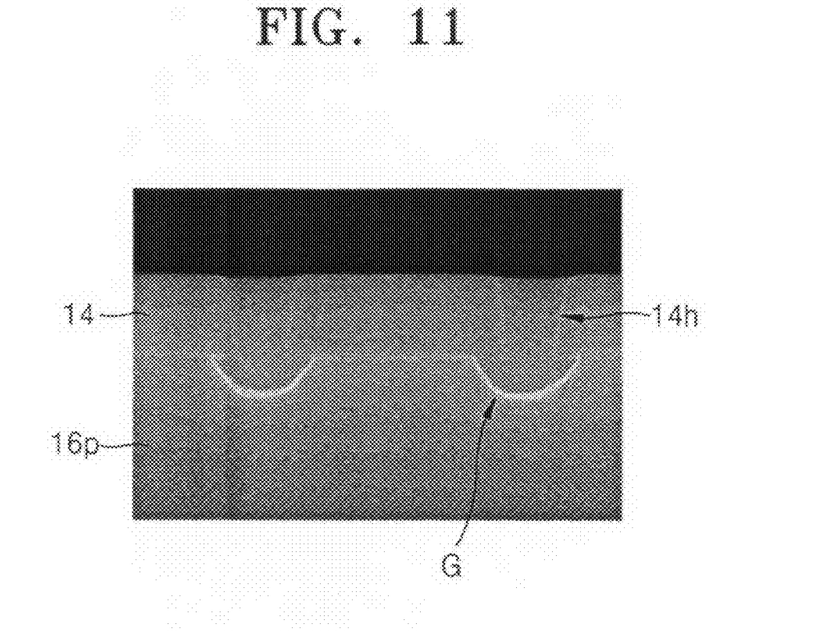
Figure 12:
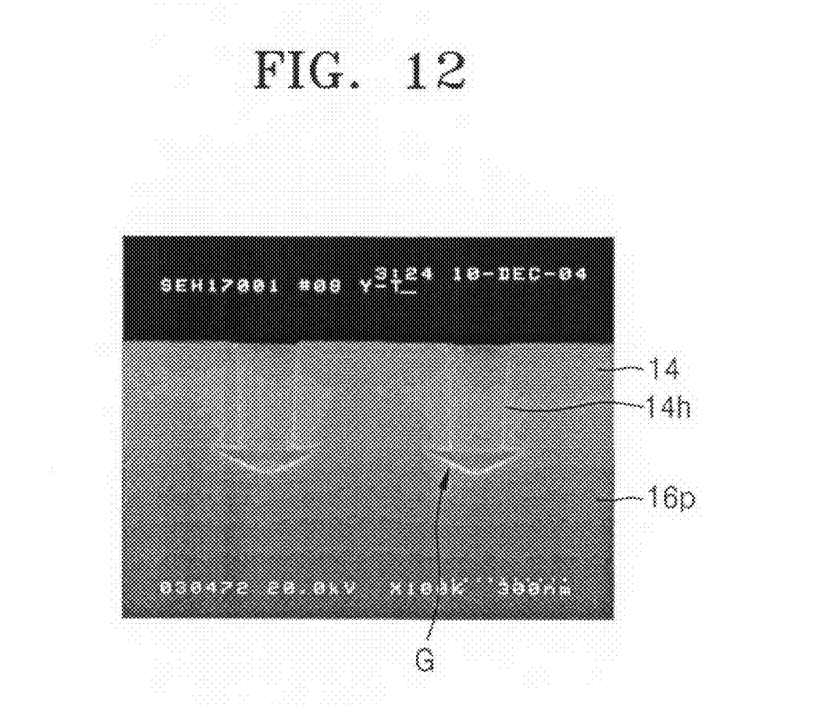

FIGS. 10 through 12 are scanning electron microscopy (SEM) photographs illustrating how the recess G may be formed using an etch-back process in the second semiconductor layer 16p of a diode exposed through the hole 14h. It can be seen from FIGS. 10 through 12 that the recess G including the undercut may be formed in the second semiconductor layer 16p according to etch-back conditions. The depth or width of the recess G may slightly vary depending on the etch-back conditions.

Referring to FIGS. 3, 4, 5, 6 and 7, after the etch-back process is performed, a barrier metal layer, that is, the diode electrode 18, may be formed to cover a surface of the recess G. In various forms, the diode electrode 18 may be formed to a thickness such that the diode electrode 18 thinly covers the surface of the recess G conforming to the non-planar surface of the recess G. In various embodiments, the diode electrode 18 may be thicker than the second semiconductor layer 16p if the recess G of the top surface of the diode D is maintained.

Figure 7:
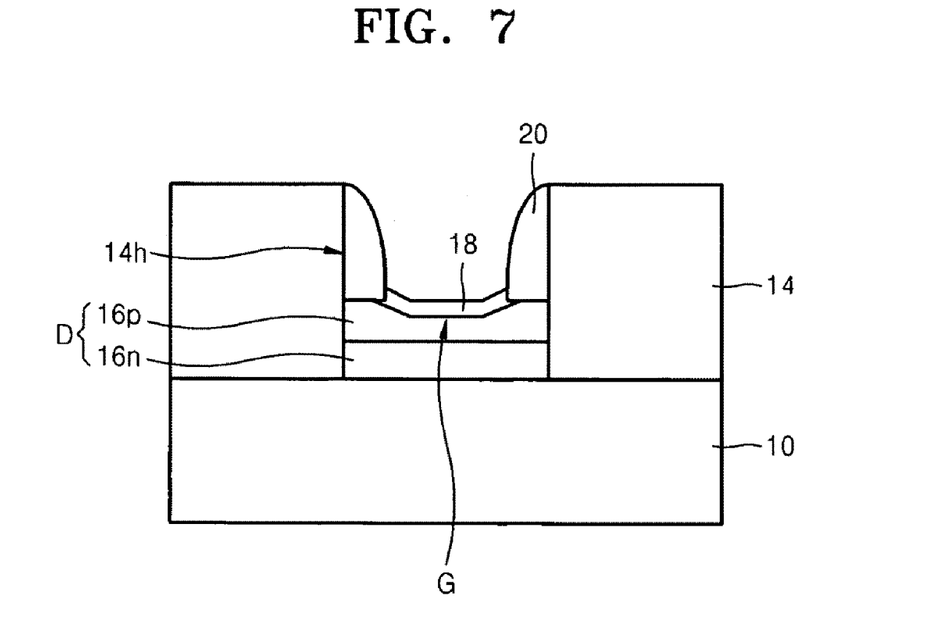
Figure 8:
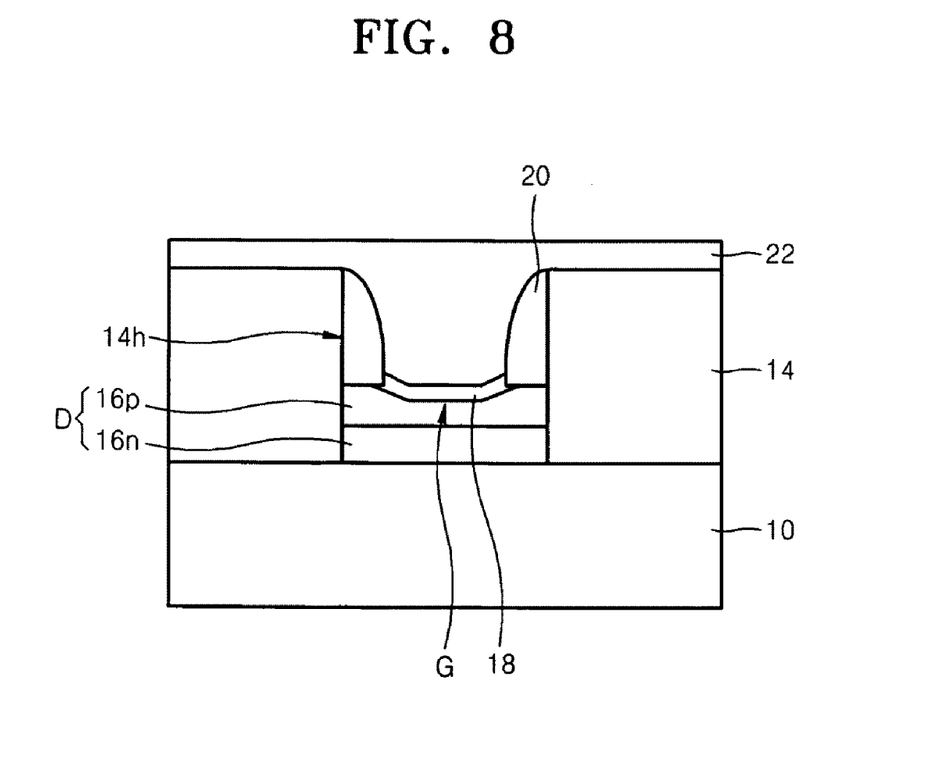

The diode electrode 18 may be formed of any suitable metal silicide such as $CoSi_2$, $NiSi_2$, or $TiSi_2$ utilizing any suitable self-aligned silicide (salicide) forming method. As illustrated in FIG. 7, after the diode electrode 18 is formed, the top surface of the diode electrode 18 may be lower than the top surface of the first insulating interlayer 14.

Figure 9:
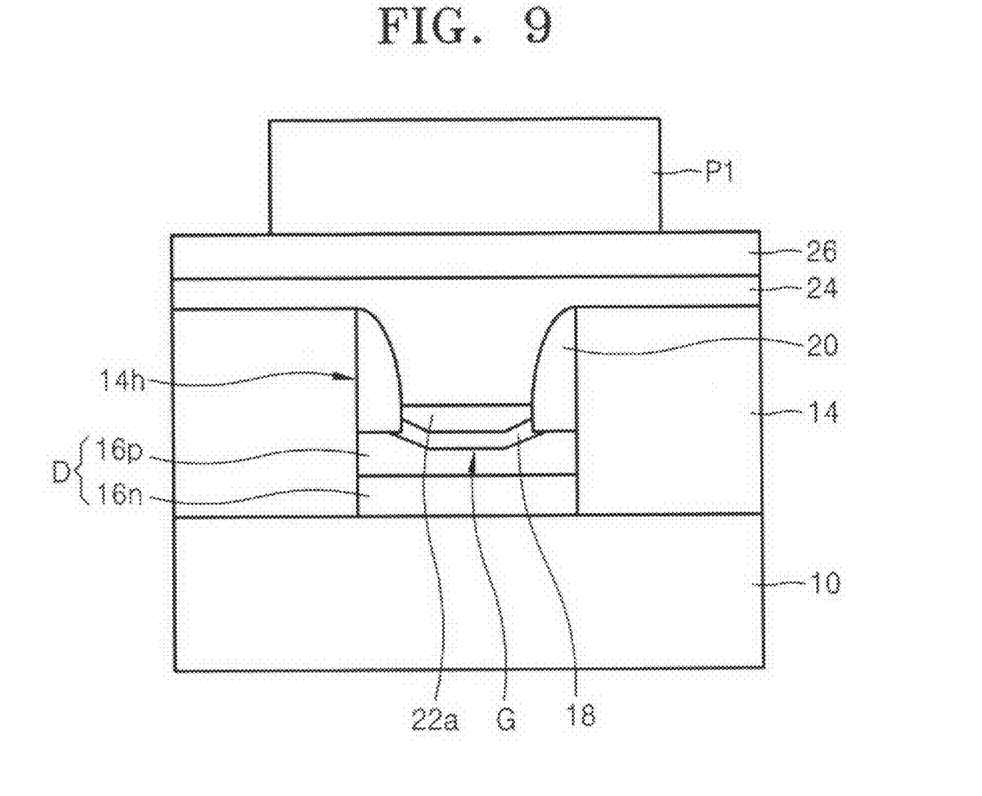

Referring to FIGS. 3, 4, 5, 6, 7 and 8, a conductive layer 22 may then be formed covering the diode electrode 18, filling the hole 14h and covering a top surface of the first insulating interlayer 14. The conductive layer 22 may be a metal layer that does not react with a phase change layer that is to be formed in a subsequent process. For example, the conductive layer 22 may be a TiN layer or a TiAlN layer. The conductive layer 22 may be etched back to a predetermined or desired thickness such that the spacers 20 are exposed and the bottom electrode 22a is formed covering the diode electrode 18, as shown in FIG. 9.

Referring to FIGS. 3, 4, 5, 6, 7, 8 and 9, as shown, the top surface of the bottom electrode 22a may be lower than the top surface of the first insulating interlayer 14. Because the top surface of the diode electrode 18 on which the bottom electrode 22a is formed conforms to the surface of the recess G, an interface between the bottom electrode 22a and the diode electrode 18 is not planar but conforms with the recess G. Therefore, a contact area between the bottom electrode 22a and the diode electrode 18 may be larger than a contact area between the bottom electrode 22a and the diode electrode 18 when the interface between the bottom electrode 22a and the diode electrode 18 is planar. After the bottom electrode 22a is formed, a phase change layer 24 that covers the bottom electrode 22a and fills the hole 14h, and a top electrode 26 may be sequentially formed. The phase change layer 24 may be a chalcogenide layer such as a GST layer and the top electrode 26 may be a TiN layer or a TiAlN layer that does not react with the phase change layer 24. Subsequently, a photosensitive layer pattern P1 may be formed on the top electrode 26 to define a storage node region. Portions of the top electrode 26 and the phase change layer 24 around the photosensitive layer pattern P1 are sequentially etched using the photosensitive layer pattern P1 as an etching mask. The photosensitive layer pattern P1 may be removed to provide the phase change memory device shown in FIG. 1, in accordance with various embodiments of the present disclosure.

A method of operating the phase change memory device of FIG. 1 will now be explained. Referring to FIG. 1, a given operating voltage may be applied to the storage node Rp in a direction in which the diode D may be turned on. In various embodiments, the operating voltage may be applied under the control of a processing device (not shown), e.g., a microprocessor, communicatively linked to the phase change memory device. The operating voltage may be a write voltage that writes data to the storage node Rp by causing a reset current to flow through the phase change layer 24. Alternatively, the operating voltage may be a read voltage that reads data previously recorded on the storage node Rp. Alternatively, the operating voltage may be an erasure voltage that erases data recorded on the storage node Rp by causing a set current to flow through the phase change layer 24. When the operating voltage is the read voltage, a resulting current flowing through the storage node Rp is measured using any suitable known measuring means, e.g., the processing device. The measured current may then be compared with a predetermined or given reference current using any suitable known comparing means, e.g., the processing device. When the measured current is greater than the reference current, an amorphous region does not exist in the phase change layer 24, indicating a binary data 1 has been read. However, when the measured current is less than the reference current, an amorphous region exists in the phase change layer, indicating a binary data 0 has been read. In alternative embodiments, the assignments of data 1 and 0 may be reversed.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

As described above, the interface between the bottom electrode 22a and the diode electrode 18 of the phase change memory device, need not be planar but rather non-planar. Hence, the contact area between the bottom electrode 22a and the diode electrode 18 is larger than a contact area between the bottom electrode 22a and the diode electrode 18 when the interface therebetween is planar.

Accordingly, a contact resistance between the bottom electrode 22a and the diode electrode 18 is reduced and thus current flowing through the interface between the bottom electrode 22a and the diode electrode 18 may be increased. Consequentially, the phase change memory device of the present disclosure may perform a desired operation over a greater range operating voltages, thereby improving reliability.

Also, because the spacer 20 covers the upper sidewall of the hole 14h, during manufacturing the phase change memory device, the bottom electrode 22a, the phase change layer 24, and the top electrode 26 may be self-aligned and formed at correct positions. Hence, the method of manufacturing the phase change memory device according to the present disclosure may improve reproducibility.

Further, because the width of each of the bottom electrode 22a and the phase change layer 24 may be controlled by adjusting the thickness of the spacer 20 during the forming of the spacer 20, heat generation efficiency in the interface between the bottom electrode 22a and the phase change layer 24 may be enhanced by reducing the width of each of the bottom electrode 22a and the phase change layer 24, thereby reducing a reset current.

While example embodiments have been particularly shown and described with reference to example embodiments thereof, it will be understood by those of ordinary skill in the art that various changes in form and details may be made therein without departing from the spirit and scope of the following claims. Therefore, the scope shall be defined by the technical idea as described in the claims and not by the example embodiments.

What is claimed is:

1. A method of manufacturing a phase change memory device, the method comprising:
    forming an insulating interlayer on a semiconductor substrate;
    forming a hole in the insulating interlayer to expose the semiconductor substrate;
    forming a diode in a lower region of the hole;
    forming a diode electrode on the diode so that an exposed surface of the diode electrode is non-planar, wherein the forming of the diode electrode includes,
        forming an annular spacer so that the annular spacer contacts the diode and covers a sidewall of the hole,
        forming a recess in a top surface of the diode inside the annular spacer, and
        covering a surface of the recess with a conductive layer;
    forming a bottom electrode in contact with and conforming to the non-planar surface of the diode electrode; and
    sequentially forming a phase change layer and a top electrode on the bottom electrode.

2. The method of claim 1, wherein the forming the diode comprises:
    filling the lower region of the hole with a semiconductor layer;
    doping a lower region of the semiconductor layer with a first conductive impurity; and
    doping an upper region of the semiconductor layer with a second conductive impurity.

3. The method of claim 2, wherein the filling the lower region of the hole with the semiconductor layer comprises:
    filling the hole with a single crystal semiconductor layer using a selective epitaxial growth method;
    planarizing a top surface of the single crystal semiconductor layer until a top surface of the first insulating interlayer is exposed; and
    removing a part of the planarized single crystal semiconductor layer from the hole.

4. The method of claim 1, wherein the diode electrode includes silicon.

5. The method of claim 4, wherein the diode electrode is formed of metal silicide.

6. The method of claim 5, wherein the metal silicide comprises at least one of $TiSi_2$, $CoSi_2$, and $NiSi_2$.

7. The method of claim 1, wherein sequentially forming the phase change layer and the top electrode comprises:
    filling the hole and covering a top surface of the insulating interlayer with the phase change layer;
    forming the top electrode on a top surface of the phase change layer; and
    etching a portion of the top diode and the phase change layer to expose a top surface of the insulating interlayer.

8. The method of claim 7, wherein etching a portion of the top electrode and the phase change layer comprises:
    forming a photosensitive layer pattern on a top surface of the top electrode;
    etching the of the top electrode and the phase change layer around the photosensitive layer pattern to define a storage node region of the phase change memory device; and
    removing the photosensitive layer pattern to expose the storage node region.

9. The method of claim 1, wherein the sequentially forming the phase change layer and the top electrode comprises:
    filling the hole to a top surface of the insulating interlayer with the phase change layer;
    forming the top electrode on top surfaces of the phase change layer and the insulating interlayer; and
    etching a portion of the top electrode to expose a top surface of the insulating interlayer.

* * * * *